US009006358B2

(12) United States Patent
Horstman et al.

(10) Patent No.: US 9,006,358 B2
(45) Date of Patent: Apr. 14, 2015

(54) COMPOSITIONS OF RESIN-LINEAR ORGANOSILOXANE BLOCK COPOLYMERS

(71) Applicant: Dow Corning Corporation, Midland, MI (US)

(72) Inventors: John Bernard Horstman, Midland, MI (US); Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/384,650

(22) PCT Filed: Mar. 1, 2013

(86) PCT No.: PCT/US2013/028580
§ 371 (c)(1),
(2) Date: Sep. 11, 2014

(87) PCT Pub. No.: WO2013/138089
PCT Pub. Date: Sep. 19, 2013

(65) Prior Publication Data
US 2015/0031826 A1 Jan. 29, 2015

Related U.S. Application Data

(60) Provisional application No. 61/609,431, filed on Mar. 12, 2012.

(51) Int. Cl.
C08G 77/44 (2006.01)
C08G 77/48 (2006.01)
C08G 81/00 (2006.01)
C08L 83/10 (2006.01)

(52) U.S. Cl.
CPC ................. *C08G 81/00* (2013.01); *C08L 83/10* (2013.01)

(58) Field of Classification Search
None
See application file for complete search history.

(56) References Cited

U.S. PATENT DOCUMENTS

| | | | | |
|---|---|---|---|---|
| 3,328,481 A | * | 6/1967 | Vincent | 525/477 |
| 3,576,905 A | * | 4/1971 | Hartlein et al. | 528/34 |
| 3,619,229 A | * | 11/1971 | Hartlein | 523/209 |
| 3,629,228 A | * | 12/1971 | Hartlein et al. | 528/17 |
| 3,647,846 A | * | 3/1972 | Hartlein et al. | 556/436 |
| 3,670,649 A | * | 6/1972 | Hartlein et al. | 102/431 |
| 4,013,611 A | * | 3/1977 | Hechtl et al. | 523/212 |
| 4,419,402 A | * | 12/1983 | Gutek | 442/145 |
| 4,443,502 A | * | 4/1984 | Gutek | 427/387 |
| 7,312,008 B2 | * | 12/2007 | Wu et al. | 430/66 |
| 2005/0180712 A1 | * | 8/2005 | Shelnut et al. | 385/129 |
| 2006/0035092 A1 | * | 2/2006 | Shimizu et al. | 428/447 |
| 2007/0196309 A1 | * | 8/2007 | Tarletsky et al. | 424/70.12 |
| 2009/0225640 A1 | | 9/2009 | Manabe et al. | |
| 2009/0297461 A1 | * | 12/2009 | Perle et al. | 424/59 |
| 2010/0081748 A1 | * | 4/2010 | Taguchi et al. | 524/433 |
| 2010/0273927 A1 | * | 10/2010 | Taguchi et al. | 524/433 |
| 2013/0172496 A1 | * | 7/2013 | Horstman et al. | 525/477 |
| 2013/0245187 A1 | * | 9/2013 | Swier et al. | 524/500 |
| 2014/0031465 A1 | * | 1/2014 | Horstman et al. | 524/158 |

FOREIGN PATENT DOCUMENTS

| | | |
|---|---|---|
| EP | 2407516 A1 | 1/2012 |
| EP | 2439225 A1 | 4/2012 |
| EP | 2450393 A1 | 5/2012 |
| WO | WO-2012/040453 A1 | 3/2012 |
| WO | WO-2012/040457 A1 | 3/2012 |
| WO | WO-2012/106391 A1 | 8/2012 |
| WO | WO-2013/138089 A1 | 9/2013 |

OTHER PUBLICATIONS

"International Application Serial No. PCT/US2013/028580, International Preliminary Report on Patentability mailed Sep. 25, 2014", 10 pgs.
"International Application Serial No. PCT/US2013/028580, International Search Report mailed Jun. 6, 2013", 4 pgs.
"International Application Serial No. PCT/US2013/028580, Written Opinion mailed Jun. 6, 2013", 8 pgs.

* cited by examiner

*Primary Examiner* — Robert S Loewe
(74) *Attorney, Agent, or Firm* — Schwegman Lundberg & Woessner, P.A.

(57) ABSTRACT

A process for preparing resin-linear organosiloxane block copolymers is disclosed. The process involves an initial hydrosilylation reaction to link a linear organosiloxane block with a resin organosiloxane portion to form the resin-linear block copolymer. The resulting resin-linear organosiloxane block copolymer is further crosslinked to provide copolymer compositions that are useful as coatings for various electronics and lighting components.

20 Claims, No Drawings

COMPOSITIONS OF RESIN-LINEAR ORGANOSILOXANE BLOCK COPOLYMERS

CROSS-REFERENCE TO RELATED APPLICATIONS

This application is a U.S. national stage application filed under 35 U.S.C. §371 from International Application Serial No. PCT/US2013/028580, which was filed Mar. 1, 2013, and published as WO 2013/138089 on Sep. 19, 2013, and which claims the benefit of U.S. Provisional Appl. Ser. No. 61/609,431, filed Mar. 12, 2012, which applications and publication are incorporated by reference as if reproduced herein and made a part hereof in their entirety, and the benefit of priority of each of which is claimed herein.

BACKGROUND

Light emitting diodes (LEDs) and solar panels use an encapsulant coating to protect electronic components from environmental factors. Such protective coatings must be optically clear to ensure maximum efficiency of these devices. Furthermore, these protective coatings must be tough, durable, long lasting, and yet easy to apply. Many of the currently available coatings, however, lack toughness; are not durable; are not long-lasting; and/or are not easy to apply. There is therefore a continuing need to identify protective and/or functional coatings in many areas of emerging technologies.

SUMMARY

Embodiment 1 relates to a process for preparing an organopolysiloxane block copolymer comprising:
I) reacting
  a) a linear organosiloxane having the formula

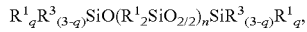

wherein:
    each $R^1$, at each occurrence, is independently a $C_1$ to $C_{30}$ hydrocarbyl free of aliphatic unsaturation,
    each $R^3$, at each occurrence, is independently H, $R^1$, or $R^4$,
  wherein
    each $R^4$, at each occurrence, is a $C_2$ to $C_{12}$ hydrocarbyl group having at least one aliphatic unsaturated bond, and
    n is 10 to 400, q is 0, 1, or 2;
  b) an organosiloxane resin having the average formula:

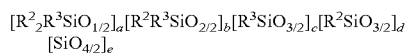

wherein:
    each $R^2$, at each occurrence, is independently a $C_1$ to $C_{20}$ hydrocarbyl free of aliphatic unsaturation,
    each $R^3$, at each occurrence, is independently H, $R^1$, or $R^4$,
    wherein each $R^4$, at each occurrence, is a $C_2$ to $C_{12}$ hydrocarbyl group having at least one aliphatic unsaturated bond,
    the subscripts a, b, c, d, and e represent the mole fraction of each siloxy unit present in the organosiloxane resin and range as follows:
    a is about 0 to about 0.7,
    b is about 0 to about 0.3,
    c is about 0 to about 0.8,
    d is about 0 to about 0.9,
    e is about 0 to about 0.7,
    with the provisos that a+b+c>0, c+d+e≥0.6, and a+b+c+d+e≈1;
    with the proviso that at least one $R^3$ substituent is H on either of the linear organosiloxane or organosiloxane resin, and at least one $R^3$ substituent is $R^4$ on the other organosiloxane; and
  c) a hydrosilylation catalyst;
    to form a resin-linear organosiloxane block copolymer;
    wherein the amounts of a) and b) used in step I) are selected to provide the resin-linear organosiloxane block copolymer with 40 to 90 mole % of disiloxy units $[R^1_2SiO_{2/2}]$ and 10 to 60 mole % of $[R^2SiO_{3/2}]$ and/or $[SiO_{4/2}]$ siloxy units, and
    wherein at least 95 weight percent of the linear organosiloxane added in step I) is incorporated into the resin-linear organosiloxane block copolymer,
II) reacting the resin-linear organosiloxane block copolymer from step I) to crosslink the $[R^2SiO_{3/2}]$ and/or $[SiO_{4/2}]$ siloxy units of the resin-linear organosiloxane block copolymer sufficiently to increase the weight average molecular weight ($M_w$) of the resin-linear organosiloxane block copolymer by at least 50%; and
III) optionally further processing the resin-linear organosiloxane block copolymer from step II).

Embodiment 2 relates to the process of Embodiment 1, wherein the further processing enhances storage stability and/or optical clarity and/or optionally adding to the resin-linear organosiloxane block copolymer from step II) a stabilizer.

Embodiment 3 relates to the process of Embodiment 1, wherein the reaction in step II) comprises a hydrosilylation reaction.

Embodiment 4 relates to the process of Embodiment 1, wherein the resin-linear organosiloxane block copolymer is formed in the presence of a solvent.

Embodiment 5 relates to the process of Embodiment 4, further comprising removing the solvent before or after the further processing.

Embodiment 6 relates to the process of Embodiment 1, wherein component a) has the average formula:

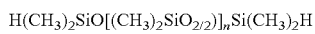

where n may vary from 10 to 400,
and component b) has the average formula

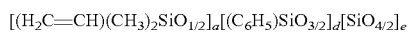

where the subscripts a, d, and e are as defined in Embodiment 1.

Embodiment 7 relates to the process of Embodiment 1, wherein component a) has the average formula

where n may vary from 10 to 400,
and component b) has the average formula

where the subscripts a and e are as defined in Embodiment 1.

Embodiment 8 relates to the process of Embodiments 1-7, wherein a crosslinker is added in step II) and/or in step I), where the crosslinker has the formula:

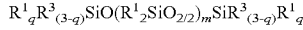

where each $R^1$, at each occurrence, is independently a $C_1$ to $C_{30}$ hydrocarbyl;
m varies from 0 to 50, q is 0, 1, or 2;
each $R^3$, at each occurrence, is independently H, $R^1$, or $R^4$,
  wherein each $R^4$, at each occurrence, is a $C_2$ to $C_{12}$ hydrocarbyl having at least one aliphatic unsaturated bond.

Embodiment 9 relates to the process of Embodiment 8, wherein the crosslinker is tetramethyldisiloxane or divinyltetramethyldisiloxane.

Embodiment 10 relates to the process of Embodiment 1, wherein step II) further comprises adding an organosilane having the formula $R^5{}_qSiX_{4-q}$, where $R^5$ is a $C_1$ to $C_8$ hydrocarbyl or a $C_1$ to $C_8$ halogen-substituted hydrocarbyl, X is a hydrolyzable group, and q is 0, 1, or 2.

Embodiment 11 relates to the process of Embodiment 10, wherein the organosilane is an alkyltriacetoxysilane.

Embodiment 12 relates to the process of Embodiment 11, wherein the alkyltriacetoxysilane is a mixture of two alkyltriacetoxysilanes.

Embodiment 13 relates to the process of Embodiment 12, wherein the mixture of two alkyltriacetoxysilanes comprise methyltriacetoxysilane and/or ethyltriacetoxysilane.

Embodiment 14 relates to the process of Embodiments 1-13, wherein the organosiloxane resin is chosen from:

$[H(CH_3)_2SiO_{1/2}]_a[(C_6H_5)SiO_{3/2}]_d$;
$[H(CH_3)_2SiO_{1/2}]_a[(CH_3)_2SiO_{2/2}]_b[(C_6H_5)SiO_{3/2}]_d$;
$[H(CH_3)_2SiO_{1/2}]_a[(C_6H_5)_2SiO_{2/2}]_b[(C_6H_5)SiO_{3/2}]_d$;
$[H(CH_3)_2SiO_{1/2}]_a[(C_6H_5)(CH_3)SiO_{2/2}]_b[(C_6H_5)SiO_{3/2}]_d$;
$[H(CH_3)_2SiO_{1/2}]_a[(C_6H_5)SiO_{3/2}]_d[SiO_{4/2}]_e$;
$[H(CH_3)_2SiO_{1/2}]_a[(CH_3)_2SiO_{2/2}]_b[SiO_{4/2}]_e$;
$[H(CH_3)_2SiO_{1/2}]_a[SiO_{4/2}]_e$; and
combinations thereof.

Embodiment 15 relates to the process of Embodiments 1-14, wherein the organosiloxane resin is chosen from:

$[Vi(CH_3)_2SiO_{1/2}]_a[(C_6H_5)SiO_{3/2}]_d$;
$[Vi(CH_3)_2SiO_{1/2}]_a[(CH_3)_2SiO_{2/2}]_b[(C_6H_5)SiO_{3/2}]_d$;
$[Vi(CH_3)_2SiO_{1/2}]_a[(C_6H_5)_2SiO_{2/2}]_b[(C_6H_5)SiO_{3/2}]_d$;
$[Vi(CH_3)_2SiO_{1/2}]_a[(C_6H_5)(CH_3)SiO_{2/2}]_b[(C_6H_5)SiO_{3/2}]_d$;
$[Vi(CH_3)_2SiO_{1/2}]_a[(C_6H_5)SiO_{3/2}]_d[SiO_{4/2}]_e$;
$[Vi(CH_3)_2SiO_{1/2}]_a[(CH_3)_2SiO_{2/2}]_b[SiO_{4/2}]_e$;
$[Vi(CH_3)_2SiO_{1/2}]_a[SiO_{4/2}]_e$; and
combinations thereof.

Embodiment 16 relates to a resin-linear organosiloxane block copolymer prepared according to Embodiments 1-15.

Embodiment 17 relates to the process of Embodiment 1, wherein said further processing comprises reacting the resin-linear organosiloxane from step II) with an endcapping compound selected from an alcohol, oxime, or trialkylsiloxy compound.

Embodiment 18 relates to the process of Embodiment 17, wherein instead of or in addition to said further processing, the organosiloxane block copolymer from step II) is contacted with a stabilizer.

Embodiment 19 relates to a resin-linear organosiloxane block copolymer comprising:

40 to 90 mole percent disiloxy units of the formula $[R^1{}_2SiO_{2/2}]$, 10 to 60 mole percent trisiloxy units of the formula $[R^2SiO_{3/2}]$, 0.5 to 10 mole percent silanol groups [≡SiOH];

wherein:
each $R^1$, at each occurrence, is independently a $C_1$ to $C_{30}$ hydrocarbyl,
each $R^2$, at each occurrence, is independently a $C_1$ to $C_{20}$ hydrocarbyl;

wherein:
the disiloxy units $[R^1{}_2SiO_{2/2}]$ are arranged in linear blocks having an average of from 10 to 400 disiloxy units $[R^1{}_2SiO_{2/2}]$ per linear block, the trisiloxy units $[R^2SiO_{3/2}]$ are arranged in non-linear blocks having a molecular weight of at least 500 g/mole, and at least 30% of the non-linear blocks are crosslinked with each other, each linear block is linked by a hydrocarbylene group to at least one non-linear block, and the organosiloxane block copolymer has an average molecular weight ($M_w$) of at least 20,000 g/mole.

Embodiment 20 relates to the resin-linear organosiloxane block copolymer of Embodiment 19, wherein the hydrocarbylene group is a $C_2$ to $C_{12}$ hydrocarbylene group.

Embodiment 21 relates to the resin-linear organosiloxane block copolymer of Embodiment 20, wherein the $C_2$ to $C_{12}$ hydrocarbylene group is —$CH_2CH_2$—.

Embodiment 22 relates to a composition comprising an organosiloxane block copolymer of Embodiments 19-21.

Embodiment 23 relates to the composition of Embodiment 22, which is curable.

Embodiment 24 relates to the composition of Embodiment 22, which is solid.

Embodiment 25 relates to the cured product of the composition of Embodiments 22-24.

Embodiment 26 relates to the solid film compositions of Embodiment 24, wherein the solid composition has an optical transmittance of at least 95%.

Embodiment 27 relates to an LED encapsulant comprising an organosiloxane block copolymer of Embodiments 19-26.

DESCRIPTION

The present disclosure provides a process for preparing certain "resin linear" organosiloxane block copolymers, as well as curable and solid compositions comprising "resin linear" organosiloxane block copolymers. The "resin-linear" organosiloxane block copolymers, curable compositions and solid compositions derived from these block copolymers offer an advantage of being "re-processable." They may also offer one or more benefits associated with silicones, including hydrophobicity, high temperature stability, and moisture/UV resistance Finally, such resin-linear organopolysiloxanes block copolymers may also provide coatings having optical transmission greater than 95%.

The organopolysiloxanes of the embodiments described herein as "resin-linear" organosiloxane block copolymers. Organopolysiloxanes are polymers containing siloxy units independently selected from $(R_3SiO_{1/2})$, $(R_2SiO_{2/2})$, [RSiO_{3/2}], or [SiO_{4/2}] siloxy units, where R may be, e.g., an organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes may contain mostly D, or $[R_2SiO_{2/2}]$ siloxy units, which results in polydiorganosiloxanes that are fluids of varying viscosities, depending on the "degree of polymerization" or "dp" as indicated by the number of D units in the polydiorganosiloxane. "Linear" organopolysiloxanes may have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin." Increasing the amount of T or Q siloxy units in an organopolysiloxane may result in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

The process for preparing "resin linear" organosiloxane block copolymers comprises:
I) reacting
a) a linear organosiloxane having the formula

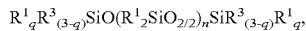

wherein:
each $R^1$, at each occurrence, is independently a $C_1$ to $C_{30}$ hydrocarbyl free of aliphatic unsaturation,
each $R^3$, at each occurrence, is independently H, $R^1$, or $R^4$, wherein each $R^4$, at each occurrence, is independently a $C_2$ to $C_{12}$ hydrocarbyl group having at least one aliphatic unsaturated bond, and
n is 10 to 400, q is 0, 1, or 2;
b) an organosiloxane resin having the average formula:

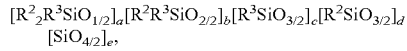

wherein:
each $R^2$, at each occurrence, is independently a $C_1$ to $C_{20}$ hydrocarbyl free of aliphatic unsaturation,
each $R^3$, at each occurrence, is independently H, $R^1$, or $R^4$, wherein each $R^4$, at each occurrence, is a $C_2$ to $C_{12}$ hydrocarbyl group having at least one aliphatic unsaturated bond,
the subscripts a, b, c, d, and e represent the mole fraction of each siloxy unit present in the organosiloxane resin and range as follows:
a is about 0 to about 0.7,
b is about 0 to about 0.3,
c is about 0 to about 0.8,
d is about 0 to about 0.9,
e is about 0 to about 0.7,
with the provisos that a+b+c>0, c+d+e≥0.6, and a+b+c+d+e≈1,
with the proviso that at least one $R^3$ substituent is H on either of the linear organosiloxane or organosiloxane resin, and at least one $R^3$ substituent is $R^4$ on the other organosiloxane; and
c) a hydrosilylation catalyst;
in an organic solvent;
to form a resin-linear organosiloxane block copolymer;
wherein the amounts of a) and b) used in step I) are selected to provide the resin-linear organosiloxane block copolymer with 40 to 90 mole % of disiloxy units $[R^1_2SiO_{2/2}]$ and 10 to 60 mole % of $[R^2SiO_{3/2}]$ and/or $[SiO_{4/2}]$ siloxy units, and
wherein at least 95 weight percent of the linear organosiloxane added in step I) is incorporated into the resin-linear organosiloxane block copolymer;
II) reacting the resin-linear organosiloxane block copolymer from step I) to crosslink the $[R^2SiO_{3/2}]$ and/or $[SiO_{4/2}]$ siloxy units of the resin-linear organosiloxane block copolymer sufficiently to increase the weight average molecular weight ($M_w$) of the resin-linear organosiloxane block copolymer by at least 50%;
III) optionally further processing the resin-linear organosiloxane block copolymer from step II) to enhance storage stability and/or optical clarity and/or optionally contacting the resin-linear organosiloxane block copolymer from step II) with a stabilizer; and
IV) optionally, removing the organic solvent.
Step I) in the process comprises reacting:
a) a linear organosiloxane having the formula

wherein:
each $R^1$, at each occurrence, is independently a $C_1$ to $C_{30}$ hydrocarbyl free of aliphatic unsaturation,
each $R^3$, at each occurrence, is independently H, $R^1$, or $R^4$, wherein each $R^4$, at each occurrence, is a $C_2$ to $C_{12}$ hydrocarbyl group having at least one aliphatic unsaturated bond, and
n is 10 to 400, q is 0, 1, or 2;
b) an organosiloxane resin having the average formula:

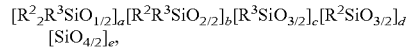

wherein:
each $R^2$, at each occurrence, is independently a $C_1$ to $C_{20}$ hydrocarbyl free of aliphatic unsaturation,
each $R^3$, at each occurrence, is independently H, $R^1$, or $R^4$, wherein each $R^4$, at each occurrence, is a $C_2$ to $C_{12}$ hydrocarbyl group having at least one aliphatic unsaturated bond,
the subscripts a, b, c, d, and e represent the mole fraction of each siloxy unit present in the organosiloxane resin and range as follows:
a is about 0 to about 0.7,
b is about 0 to about 0.3,
c is about 0 to about 0.8,
d is about 0 to about 0.9,
e is about 0 to about 0.7,
with the provisos that a+b+c>0, c+d+e≥0.6, and a+b+c+d+e≈1,
with the proviso that at least one $R^3$ substituent is H on either of the linear organosiloxane or organosiloxane resin, and at least one $R^3$ substituent is $R^4$ on the other organosiloxane; and
c) a hydrosilylation catalyst;
in an organic solvent:
to form a resin-linear organosiloxane block copolymer;
wherein the amounts of a) and b) used in step I) are selected to provide the resin-linear organosiloxane block copolymer with 40 to 90 mole % of disiloxy units $[R^1_2SiO_{2/2}]$ and 10 to 60 mole % of $[R^2SiO_{3/2}]$ and/or $[SiO_{4/2}]$ siloxy units, and wherein at least 95 weight percent of the linear organosiloxane added in step I) is incorporated into the resin-linear organosiloxane block copolymer.

The reaction effected in step I) is a hydrosilylation reaction. Hydrosilylation involves the catalytically enhanced reaction of a molecule containing at least one Si—H unit and a molecule containing at least one unsaturated aliphatic hydrocarbon in which the Si—H bond adds across the unsaturated group to form a Si—C bond. In the hydrosilylation reaction of step I, the Si—H-containing units may be present on either component a) or b). Likewise, the aliphatic unsaturated bonds may be present on either component a) or b). In some embodiments, if the Si—H-containing units are present on component a), then component b) contains aliphatic unsaturated bonds for the hydrosilylation reaction to proceed between the two components. In other embodiments, if the Si—H-containing units are present on component b), then component a) contains aliphatic unsaturated bonds for the hydrosilylation reaction to proceed.

The Linear Organosiloxane

Component a) in step I) of the process is a linear organosiloxane having the formula $R^1_qR^3_{(3-q)}SiO(R^1_2SiO_{2/2})_n SiR^3_{(3-q)}R^1_q$, wherein each $R^1$, at each occurrence, is independently a $C_1$ to $C_{30}$ hydrocarbyl free of aliphatic unsaturation; each $R^3$, at each occurrence, is independently H, $R^1$, or $R^4$, wherein each $R^4$, at each occurrence, is a $C_2$ to $C_{12}$ hydrocarbyl group having at least one aliphatic unsaturated bond; n is 10 to 400; and q is 0, 1, or 2. The subscript "n" may be considered as the degree of polymerization (dp) of the linear organosiloxane and may vary from 10 to 400 (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units).

While component a) is described as a linear organosiloxane having the formula $R^1{}_qR^3{}_{(3-q)}SiO(R^1{}_2SiO_{2/2})_nSiR^3{}_{(3-q)}R^1{}_q$, one skilled in the art recognizes small amount of alternative siloxy units, such a T ($R^1SiO_{3/2}$) siloxy units, may be incorporated into the linear organosiloxane of component a). As such, the organosiloxane may be considered as being "predominately" linear by having a majority of D ($R^1{}_2SiO_{2/2}$) siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

At each occurrence, each $R^1$ in the above linear organosiloxane is independently a $C_1$ to $C_{30}$ hydrocarbyl free of aliphatic unsaturation, where the hydrocarbyl group may independently be an alkyl, aryl, or alkylaryl group. Each $R^1$, at each occurrence, may independently be a $C_1$ to $C_{30}$ alkyl group, alternatively each $R^1$, at each occurrence, may independently be a $C_1$ to $C_{18}$ alkyl group. Alternatively, at each occurrence, each $R^1$ may independently be a $C_1$ to $C_6$ alkyl group such as methyl, ethyl, propyl, butyl, pentyl, or hexyl. Alternatively, at each occurrence, each $R^1$ may independently be methyl. Each $R^1$, at each occurrence, may independently be an aryl group, such as phenyl, naphthyl or an anthryl group. Alternatively, at each occurrence, each $R^1$ may independently be any combination of the aforementioned alkyl or aryl groups. Alternatively, at each occurrence, each $R^1$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

Each $R^3$, at each occurrence, is independently H, $R^1$ (as defined herein), or $R^4$, wherein each $R^4$, at each occurrence, is a $C_2$ to $C_{12}$ hydrocarbyl group having at least one aliphatic unsaturated bond, with the understanding that $R^4$ groups having at least one aliphatic unsaturated bond that have reacted with an Si—H group are $C_2$ to $C_{12}$ hydrocarbylene groups that connect, e.g., the components a) and b), above.

Examples of aliphatic unsaturated bonds include, but are not limited to, alkenyl or alkynyl bonds. In some embodiments, the aliphatic unsaturated bond in $R^4$ is a terminal double bond. Examples of $C_2$ to $C_{12}$ (e.g., C2 to $C_6$; $C_3$ to $C_8$; or $C_4$ to $C_{12}$) hydrocarbyl groups include, but are not limited to, $H_2C=CH-$, $H_2C=CHCH_2-$, $H_2C=C(CH_3)CH_2-$, $H_2C=CHC(CH_3)_2-$, $H_2C=CHCH_2CH_2-$, $H_2C=CHCH_2CH_2CH_2-$, and $H_2C=CHCH_2CH_2CH_2CH_2-$. Other examples of $C_2$ to $C_{12}$ hydrocarbyl groups include, but are not limited to $HC\equiv C-$, $HC\equiv CCH_2-$, $HC\equiv CCH(CH_3)-$, $HC\equiv CC(CH_3)_2-$, and $HC\equiv CC(CH_3)_2CH_2-$. Alternatively $R^4$ is a vinyl group, $H_2C=CH-$.

As used herein, the term "$C_2$ to $C_{12}$ hydrocarbylene" refers broadly to any $C_2$ to $C_{12}$ (e.g., $C_2$ to $C_6$; $C_3$ to $C_8$; or $C_4$ to $C_{12}$) hydrocarbon having two free valences. Such hydrocarbons include, but are not limited to, alkylene groups, including, but not limited to $-H_2CCH_2-$, $-H_2CCH_2CH_2-$, $-H_2CHC(CH_3)CH_2-$, $-H_2CCH_2C(CH_3)_2-$, $-H_2CCH_2CH_2CH_2-$, $-H_2CCH_2CH_2CH_2CH_2-$, and $-H_2CCH_2CH_2CH_2CH_2CH_2-$; and arylene groups, including, but not limited to phenylene groups (e.g., a phenyl group having two open valences); or combinations of alkylene and arylene groups (e.g., an alkylene-arylene group, where the alkylene group is connected to the arylene group and the alkylene and the arylene groups each have an open valence).

The Organosiloxane Resin

Component b) in an organosiloxane resin having the average formula $[R^2{}_2R^3SiO_{1/2}]_a[R^2R^3SiO_{2/2}]_b[R^3SiO_{3/2}]_c[R^2SiO_{3/2}]_d[SiO_{4/2}]_e$, wherein each $R^2$, at each occurrence, is independently a $C_1$ to $C_{20}$ hydrocarbyl free of aliphatic unsaturation; each $R^3$, at each occurrence, is independently H, $R^1$, or $R^4$, wherein each $R^4$, at each occurrence, is a $C_2$ to $C_{12}$ hydrocarbyl group having at least one aliphatic unsaturated bond; and the subscripts a, b, c, d, and e represent the mole fraction of each siloxy unit present in the organosiloxane resin and range as follows: a is about 0 to about 0.7, b is about 0 to about 0.3, c is about 0 to about 0.8, d is about 0 to about 0.9, e is about 0 to about 0.7, with the provisos that a+b+c>0, c+d+e≥0.6, and a+b+c+d+e≈1.

The organosiloxane resin may contain any amount and combination of other M, D, T, and Q siloxy units, provided the organosiloxane resin contains at least 60 mole % of $[R^2SiO_{3/2}]$ (T units) and/or $[SiO_{4/2}]$ (Q units) siloxy units, alternatively the organosiloxane resin contains at least 70 mole % of $[R^2SiO_{3/2}]$ and/or $[SiO_{4/2}]$ siloxy units, at least 80 mole % of $[R^2SiO_{3/2}]$ and/or $[SiO_{4/2}]$ siloxy units, alternatively the organosiloxane resin contains at least 90 mole % of $[R^2SiO_{3/2}]$ and/or $[SiO_{4/2}]$ siloxy units, or alternatively the organosiloxane resin contains at least 95 mole % of $[R^2SiO_{3/2}]$ and/or $[SiO_{4/2}]$ siloxy units. In some embodiments, the organosiloxane resin contains from about 60 to about 100 mole % of $[R^2SiO_{3/2}]$ and/or $[SiO_{4/2}]$ siloxy units, e.g., from about 60 to about 95 mole % of $[R^2SiO_{3/2}]$ and/or $[SiO_{4/2}]$ siloxy units, from about 60 to about 85 mole % of $[R^2SiO_{3/2}]$ and/or $[SiO_{4/2}]$ siloxy units, from about 80 to about 95 mole % of $[R^2SiO_{3/2}]$ and/or $[SiO_{4/2}]$ siloxy units or from about 90 to about 95 mole % of $[R^2SiO_{3/2}]$ and/or $[SiO_{4/2}]$ siloxy units. Organosiloxane resins useful as component b) include those known as "silsesquioxane" resins and "MQ" resins including MQ resins where a portion of the M units contain an $R^3$ group as defined herein. MQ resins such as $M^HQ$ or $M^{Vi}Q$, where "Vi" refers broadly to a moiety comprising a vinyl group, include, but are not limited to those disclosed in U.S. Pat. No. 2,857,356, which is incorporated by reference as if fully set forth herein. The '356 patent discloses a method for the preparation of an MQ resin by the cohydrolysis of a mixture of an alkyl silicate and a hydrolyzable trialkylsilane, and an organopolysiloxane with water.

At each occurrence, each $R^2$ in the above organosiloxane resin is independently a $C_1$ to $C_{20}$ hydrocarbyl (e.g., $C_1$ to $C_{10}$ hydrocarbyl) free of aliphatic unsaturation, where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl) alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

The weight average molecular weight ($M_w$) of the organosiloxane resin is not limiting, but, in some embodiments, ranges from 1000 to 10000, or alternatively 1500 to 5000 g/mole.

The organosiloxane resins selected as component b) also contain siloxy units selected from those having a formula $[R^2{}_2R^3SiO_{1/2}]$, $[R^2R^3SiO_{2/2}]$, $[R^3SiO_{3/2}]$, or a combination of these, where $R^3$ is H, $R^1$, or $R^4$ as defined herein. As discussed above, the presence of siloxy units containing the $R^3$ group in the organosiloxane resin provides a reactive substituent for the hydrosilylation reaction in step I). In some embodiments, when $R^3$ is H in the siloxy units on the organosiloxane resin, $R^3$ on the linear organosiloxane may be an $R^4$ group containing an unsaturated aliphatic bond, and vice versa.

The above formulae and related formulae using mole fractions, as used herein to describe the present organosiloxanes, does not indicate structural ordering of the various siloxy units in the copolymer. Rather, this formula is meant to provide a convenient notation to describe the relative amounts of the siloxy units in the copolymer, as per the mole fractions described herein via the subscripts. The mole fractions of the various siloxy units in the present organosiloxanes, as well as the silanol content, may be readily determined by $^{29}$Si NMR techniques.

Representative, non-limiting examples of Si—H-containing organosiloxane resins (i.e., where $R^3$ is H) of the above formula include, but are not limited to:

$[H(CH_3)_2SiO_{1/2}]_a[(C_6H_5)SiO_{3/2}]_d$,
$[H(CH_3)_2SiO_{1/2}]_a[(CH_3)_2SiO_{2/2}]_b[(C_6H_5)SiO_{3/2}]_d$,
$[H(CH_3)_2SiO_{1/2}]_a[(C_6H_5)_2SiO_{2/2}]_b[(C_6H_5)SiO_{3/2}]_d$,
$[H(CH_3)_2SiO_{1/2}]_a[(C_6H_5)(CH_3)SiO_{2/2}]_b[(C_6H_5)SiO_{3/2}]_d$,
$[H(CH_3)_2SiO_{1/2}]_a[(C_6H_5)SiO_{3/2}]_d[SiO_{4/2}]_e$,
$[H(CH_3)_2SiO_{1/2}]_a[(CH_3)_2SiO_{2/2}]_b[SiO_{4/2}]_e$, and
$[H(CH_3)_2SiO_{1/2}]_a[SiO_{4/2}]_e$, where the subscripts a, b, c, d, and e are as defined herein.

Representative, non-limiting examples of organosiloxane resins containing an unsaturated aliphatic bond (i.e., $R^3$ is $R^4$) of the above formula include:

$[Vi(CH_3)_2SiO_{1/2}]_a[(C_6H_5)SiO_{3/2}]_d$,
$[Vi(CH_3)_2SiO_{1/2}]_a[(CH_3)_2SiO_{2/2}]_b[(C_6H_5)SiO_{3/2}]_d$,
$[Vi(CH_3)_2SiO_{1/2}]_a[(C_6H_5)_2SiO_{2/2}]_b[(C_6H_5)SiO_{3/2}]_d$,
$[Vi(CH_3)_2SiO_{1/2}]_a[(C_6H_5)(CH_3)SiO_{2/2}]_b[(C_6H_5)SiO_{3/2}]_d$,
$[Vi(CH_3)_2SiO_{1/2}]_a[(C_6H_5)SiO_{3/2}]_d[SiO_{4/2}]_e$,
$[Vi(CH_3)_2SiO_{1/2}]_a[(CH_3)_2SiO_{2/2}]_b[SiO_{4/2}]_e$, and
$[Vi(CH_3)_2SiO_{1/2}]_a[SiO_{4/2}]_e$, where the subscripts a, b, c, d, and e are as defined herein and "Vi" refers broadly to a moiety comprising a vinyl group.

One skilled in the art recognizes that organosiloxane resins containing such high amounts of $[R^2SiO_{3/2}]$ siloxy units may have a certain concentration of Si—OZ where Z may be hydrogen (i.e., silanol) or an alkyl group (so that OZ is an alkoxy group). The Si—OZ content as a mole percentage of all siloxy groups present on the organosiloxane resin may be readily determined by $^{29}$Si NMR. The concentration of the OZ groups present on the organosiloxane resin may vary, as dependent on the mode of preparation, and subsequent treatment of the resin. In some embodiments, the silanol (Si—OH) content of organosiloxane resins suitable for use in the present process will have a silanol content of at most 25 mole %, alternatively of at most 20 mole %, alternatively at most 15 mole %, alternatively at most 10 mole %, or alternatively at most 5 mole %. In other embodiments, the silanol content is from about 0.5 mole % to about 25 mole %, e.g., from about 5 mole % to about 25 mole %, from about 5 mole % to about 10 mole %, from about 10 mole % to about 25 mole %, from about 5 mole % to about 15 mole % or from about 5 mole % to about 20 mole %.

One skilled in the art further recognizes that organosiloxane resins containing such high amounts of $[R^2SiO_{3/2}]$ siloxy units and silanol contents may also retain water molecules, especially in high humidity conditions. Thus, it is often beneficial to remove excess water present on the resin by "drying" the organosiloxane resin prior to reacting in step I). This may be achieved by dissolving the organosiloxane resin in an organic solvent, heating to reflux, and removing water by separation techniques (for example, Dean Stark trap or equivalent process).

Organosiloxane resins containing at least 60 mole % of $[R^2SiO_{3/2}]$ or $[SiO_{4/2}]$ siloxy units, and at least two siloxy units selected from those having a formula $[R^2{}_2R^3SiO_{1/2}]$, $[R^2R^3SiO_{2/2}]$, $[R^3SiO_{3/2}]$, or a combination of these, and methods for preparing them are known in the art. In some embodiments, they are prepared by hydrolyzing an organosilane having three hydrolyzable groups on the silicon atom, such as a halogen or an alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.). It should be mentioned however, that such resins would have to be modified to include a Si—H bond or unsaturated groups, such as vinyl groups. Method for modifying such commercially available resins are known in the art.

The amounts of a) and b) used in the reaction of step I) are selected to provide the resin-linear organosiloxane block copolymer with 40 to 90 mole % of disiloxy units $[R^1{}_2SiO_{2/2}]$ and 10 to 60 mole % of trisiloxy units $[R^2SiO_{3/2}]$. The mole % of dilsiloxy and trisiloxy units present in components a) and b) may be readily determined using $^{29}$Si NMR techniques. The starting mole % then determines the mass amounts of components a) and b) used in step I).

In some embodiments, the amounts of components a) and b) used in step I) are selected to provide a Si—H/unsaturated bond ratio, depending on the molar quantity of Si—H units and unsaturated bonds present in the components. In some embodiments, the molar ratio of Si—H/unsaturated bonds may vary from 10/1 to 1/10 (e.g., 8:1 to 1:8; 7:1 to 1:7; 6:1 to 1:6; 5:1 to 1:5; 4:1 to 1:4; 3:1 to 1:3; 2:1 to 1:2; and 1:1). In certain embodiments, the molar ratio of Si—H/unsaturated bonds provides a molar excess of Si—H units in the reaction so as to ensure Si—H units remain on the formed resin-linear organosiloxane block copolymer of step I). In one embodiment, the molar ratio of Si—H/unsaturated bonds varies from 10/1 to 1.5/1, e.g., 7:1, 6:1, 5:1, 3:1, 2:1 or 1.5:1.

In some embodiments, the amounts of components a) and b) are selected to ensure that a sufficient amount of the organosiloxane resin is added such that a majority (e.g., greater than 75%, greater than 80%, greater than 90%; greater than 95%; or greater than 99%; or from about 75% to about 95%, from about 80% to about 90%, or from about 75% to about 85%) of linear organosiloxane added in step I) react with the resin. These amounts may be calculated based on the molar quantities of Si—H and unsaturated groups present initially on components a) and b). In some embodiments these amounts are selected to allow at least 95 weight percent of the linear organosiloxane added in step I) to be incorporated into the resin-linear organosiloxane block copolymer formed in step I).

In one embodiment of the process, the amounts and selection of components a) and b) used in step I) are such that the resulting resin-linear organopolysiloxane block copolymer has negligible or no residual Si—H units. In other embodiments of the process, the amounts and selection of components a) and b) used in step I) are such that the resulting resin-linear organopolysiloxane block copolymer has negligible or no residual aliphatic unsaturation.

Component c) is a hydrosilylation catalyst. The hydrosilylation catalyst may be any suitable Group VIII metal based catalyst selected from a platinum, rhodium, iridium, palladium or ruthenium. Group VIII group metal containing catalysts useful to catalyze the hydrosilylation reaction can be any catalyst known to catalyze reactions of silicon bonded hydrogen atoms with silicon bonded moieties comprising unsaturated hydrocarbon groups. In some embodiments, the Group VIII metal for use as a catalyst to effect the hydrosilylation is a platinum based catalyst such as platinum metal, platinum compounds and platinum complexes.

Suitable platinum catalysts include, but are not limited to, the catalyst described in U.S. Pat. No. 2,823,218 (e.g., "Speier's catalyst") and U.S. Pat. No. 3,923,705, the entireties of both of which are incorporated by reference as if fully set forth herein. Other suitable platinum catalysts include, but are not limited to, the platinum catalyst referred to as "Karstedt's catalyst," which are described in U.S. Pat. Nos. 3,715,334 and 3,814,730. Karstedt's catalyst is a platinum divinyl tetramethyl disiloxane complex, in some cases, containing about one-weight percent of platinum in a solvent such as toluene. Alternatively platinum catalysts include, but are not limited to, the reaction product of chloroplatinic acid and an organosilicon compound containing terminal aliphatic unsaturation, including the catalysts described in U.S. Pat. No. 3,419,593, the entirety of which is incorporated by reference as if fully set forth herein. Alternatively, hydrosilyation catalysts include, but are not limited to, neutralized complexes of platinum chloride and divinyl tetramethyl disiloxane, as described in U.S. Pat. No. 5,175,325. Further suitable hydrosilylation catalysts are described in, for example, U.S. Pat. Nos. 3,159,601; 3,220,972; 3,296,291; 3,516,946; 3,989,668; 4,784,879; 5,036,117; and 5,175,325 and EP 0 347 895 B1.

The hydrosilylation catalyst may be added in an amount equivalent to as little as 0.001 parts by weight of elemental platinum group metal, per one million parts (ppm) of the total reaction composition. In some embodiments, the concentration of the hydrosilylation catalyst in the reaction composition is the concentration capable of providing the equivalent of at least 1 part per million of elemental platinum group metal. A catalyst concentration providing the equivalent of 1 to 500, alternatively 50 to 500, alternatively 50 to 200 parts per million of elemental platinum group metal may be used.

The reaction effected in step I) is a hydrosilylation reaction, wherein the Si—H units of component a) or b) react with the unsaturated aliphatic hydrocarbon group of component a) or b) form a Si—C bond. The reaction may be conducted under those conditions known in the art for effecting hydrosilylations reactions.

The hydrosilylation reaction can be conducted neat or in the presence of a solvent. The solvent can be an alcohol such as methanol, ethanol, isopropanol, butanol, or n-propanol; a ketone such as acetone, methylethyl ketone, or methyl isobutyl ketone; an aromatic hydrocarbon such as benzene, toluene, or xylene; an aliphatic hydrocarbon such as heptane, hexane, or octane; a glycol ether such as propylene glycol methyl ether, dipropylene glycol methyl ether, propylene glycol n-butyl ether, propylene glycol n-propyl ether, or ethylene glycol n-butyl ether; a halogenated hydrocarbon such as dichloromethane, 1,1,1-trichloroethane, methylene chloride or chloroform; dimethyl sulfoxide; dimethyl formamide; acetonitrile; tetrahydrofuran; white spirits; mineral spirits; or naphtha. Combinations of one or more of the aforementioned solvents are also contemplated.

The amount of solvent can be up to 70 weight percent (e.g., from about 20 to about 70 weight percent; from about 20 to about 50 weight percent; from about 30 to about 50 weight percent; or from about 40 to about 50 weight percent), but is, in some embodiments, from 20 to 50 weight percent, said weight percent being based on the total weight of components in the hydrosilylation reaction. The solvent used during the hydrosilylation reaction can be subsequently removed from the resulting product by various known methods.

The reaction conditions for reacting the aforementioned (a) linear organosiloxane with the (b) organosiloxane resin are not limited. Various non-limiting embodiments and reaction conditions are described in the Examples below. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. In some embodiments, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar, such as the representative solvents mentioned above. The amount of the organosiloxane resin dissolved in the organic solvent may vary, but, in some embodiments, the amount should be selected to minimize the chain extension of the linear organosiloxane or pre-mature condensation of the organosiloxane resin.

The order of addition of components a) and b) may vary. In some embodiments, the linear organosiloxane is added to a solution of the organosiloxane resin dissolved in the organic solvent. In other embodiments, the organosiloxane resin is added to a solution of the linear organosiloxane dissolved in the organic solvent.

The progress of the reaction in step I), and the formation of the resin-linear organosiloxane block copolymer, may be monitored by various analytical techniques, such as GPC, IR, or $^{29}$Si NMR. In some embodiments, the reaction in step I) is allowed to continue until at least 95 weight percent (e.g., at least 96%, at least 97%, at least 98%, at least 99% or 100%) of the linear organosiloxane added in step I) is incorporated into the resin-linear organosiloxane block copolymer.

Additional components can be added to the hydrosilylation reaction which are known to enhance such reactions. These components include salts such as sodium acetate which have a buffering effect in combination with platinum catalysts.

In one embodiment, component a) has the average formula $H(CH_3)_2SiO[(CH_3)_2SiO_{2/2})]_nSi(CH_3)_2H$, where n may vary from 10 to 400 (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and component b) has the average formula $[(H_2C=CH)(CH_3)_2SiO_{1/2}]_a[(C_6H_5)SiO_{3/2}]_d[SiO_{4/2}]_e$ where the subscripts a, d, and e are as defined herein.

In one embodiment, component a) has the average formula $(H_2C=CH)(CH_3)_2SiO[(CH_3)_2SiO_{2/2})]_nSi(CH_3)_2(HC=CH_2)$ where n may vary from 10 to 400 (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and component b) has the average formula $[H(CH_3)_2SiO_{1/2}]_a[SiO_{4/2}]_e$ where the subscripts a and e are as defined herein.

In an alternative embodiment, the resin-linear organosiloxane block copolymer of step I) may be formed by a hydrosilylation reaction wherein one or more suitable crosslinkers are added in step I), where the crosslinker crosslinks components a) and component b). In some embodiments, $R^3$ is the same on component a) and b), that is $R^3$ is H or $R^4$ on both the linear and resin component. The crosslinker is then selected to react via the hydrosilylation reaction in step I) accordingly.

Suitable crosslinkers may be selected from those having the formula $R^1_qR^3_{(3-q)}SiO(R^1_2SiO_{2/2})_mSiR^3_{(3-q)}R^1_q$ where each $R^1$ is as defined herein; m varies from 0 to 50 (e.g., about 10 to about 50 D units; about 20 to about 50 D units; about 5 to about 40 D units; or about 10 to about 40 D units), alternatively 0 to 10, alternatively 0 to 5, alternatively m is 0; q is 0, 1, or 2, alternatively q is 2; $R^3$ is H, $R^1$, or $R^4$, as each term is defined herein. The crosslinker is added as an additional component in step I. In some embodiments, when $R^3$ is H on both components a) and b), $R^3$ may be, e.g., a $C_2$ to $C_{12}$ hydrocarbyl having at least one aliphatic unsaturated bond on the crosslinker. In other embodiments, if $R^3$ is a $C_2$ to $C_{12}$ hydrocarbyl having at least one aliphatic unsaturated bond on components a) and b), then $R^3$ is H on the crosslinker. The amount of crosslinker added in step I) in some embodiments may vary, but is selected, in some embodiments, by molar stoichiometry to provide an amount such that the crosslinker may be substantially (e.g., completely) consumed in the hydrosilylation reaction of step I).

Step II) of the present process involves further reacting the resin-linear organosiloxane block copolymer from step I) to crosslink the $[R^2SiO_{3/2}]$ or $[SiO_{4/2}]$ siloxy units of the resin-linear organosiloxane block copolymer to increase the molecular weight of the resin-linear organosiloxane block copolymer by at least 50%, alternatively by at least 60%, alternatively by 70%, alternatively by at least 80%, alternatively by at least 90%, or alternatively by at least 100%. In some embodiments, step II) of the present process involves further reacting the resin-linear organosiloxane block copolymer from step I) to crosslink the $[R^2SiO_{3/2}]$ or $[SiO_{4/2}]$ siloxy units of the resin-linear organosiloxane block copolymer to increase the molecular weight of the resin-linear organosiloxane block copolymer from about 50% to about 100%, e.g., from about 60% to about 100%, from about 70% to about 100%, from about 80% to about 100% or from about 90% to about 100%.

It is believed that the reaction of step II) crosslinks the $[R^2SiO_{3/2}]$ and/or $[SiO_{4/2}]$ blocks of the resin-linear organosiloxane block copolymer formed in step I), which may increase the average molecular weight of the block copolymer. It is also possible that the crosslinking of the $[R^2SiO_{3/2}]$ or $[SiO_{4/2}]$ blocks provides the block copolymer with an aggregated concentration of $[R^2SiO_{3/2}]$ or $[SiO_{4/2}]$ blocks, which ultimately may help to form "nano-domains" in solid compositions of the block copolymer. In other words, this aggregated concentration of $[R^2SiO_{3/2}]$ or $[SiO_{4/2}]$ blocks may phase separate when the block copolymer is isolated in a solid form such as a film or cured coating. The aggregated concentration of $[R^2SiO_{3/2}]$ or $[SiO_{4/2}]$ block within the block copolymer and subsequent formation of "nano-domains" in the solid compositions containing the block copolymer, may provide for enhanced optical clarity of these compositions as well as the other physical property benefits associated with these materials.

The crosslinking reaction in step II) may be accomplished via a variety of chemical mechanisms and/or moieties. For example, crosslinking of non-linear blocks within the block copolymer may result from the condensation of residual silanol groups present in the non-linear blocks of the copolymer and/or via hydrosylilation between, e.g., Si—H bonds and $R^4$ groups remaining unreacted on the non-linear blocks. Crosslinking of the non-linear blocks within the block copolymer may also occur between "free resin" components and the non-linear blocks via silanol condensation and/or hydrosilylation. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-blocks and on the free resin. The free resin may provide crosslinking by reacting with lower molecular weight compounds added as crosslinkers. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein. The free resin may provide crosslinking by reacting with lower molecular weight compounds added as crosslinkers.

Step II) of the present process may occur simultaneous upon formation of the resin-linear organosiloxane of step I), or involve a separate reaction in which conditions have been modified to affect the step II) reaction. The step II) reaction may occur in the same conditions as step I). In this situation, the step II) reaction proceeds as the resin-linear organosiloxane copolymer is formed. Alternatively, the reaction conditions used for step I) are extended to further the step II) reaction. Alternatively, the reaction conditions may be changed, or additional ingredients added to affect the step II) reaction.

In other embodiments, an organosilane having the formula $R^5_qSiX_{4-q}$ may be added as a crosslinker during step II), in addition to or in place of a crosslinker of the formula $R^1_q$ $R^3{}_{(3-q)}SiO(R^1{}_2SiO_{2/2})_mSiR^3{}_{(3-q)}R^1{}_q$. In the organosilane having the formula $R^5{}_qSiX_{4-q}$, $R^5$ is a $C_1$ to $C_8$ hydrocarbyl or a $C_1$ to $C_8$ halogen-substituted hydrocarbyl; X is a hydrolyzable group; and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group including oximo groups, epoxy groups, carboxy groups, amino groups, amido groups or combinations thereof. Alternatively, the hydrolyzable group may have the formula $R^1C(=O)O—$, $R^1{}_2C=N—O—$, or $R^1C=N—O—$, where $R^1$ is as defined herein. In one embodiment, the hydrolyzable group is $H_3CC(=O)O—$ (acetoxy). In another embodiment, the hydrolyzable group is $(CH_3)(CH_3CH_2)C=N—O—$ (methylethylketoximyl). Alternatively X may be a halogen atom, hydroxyl (OH), or an alkoxy group. In one embodiment, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful in some embodiments include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime) silane.

The amount of organosilane having the formula $R^5{}_qSiX_{4-q}$ when added during step II) may vary, but, in some embodiments, is based on the amount of organosiloxane resin used in the process. The amount of silane used may provide a molar stoichiometry of 2 to 15 mole % of organosilane per moles of Si in the organosiloxane resin, e.g., 2 to 10 mole % of organosilane/moles of Si in the organosiloxane resin; 5 to 15 mole % of organosilane/moles of Si in the organosiloxane resin; 2 to 5 mole % of organosilane/moles of Si in the organosiloxane resin; 10 to 15 mole % of organosilane/moles of Si in the organosiloxane resin; 5 to 10 mole % of organosilane/moles of Si in the organosiloxane resin; or 2 to 12 mole % of organosilane/moles of Si in the organosiloxane resin. Furthermore, the amount of the organosilane having the formula $R^5{}_qSiX_{4-q}$ added during step II) may be controlled, in some embodiments, to ensure a stoichiometry that does not consume all the silanol groups on the organosiloxane resin component. In one embodiment, the amount of the organosilane added in step II) may be selected to provide an organosiloxane block copolymer containing 0.5 to 10 mole percent of silanol groups [≡SiOH] (e.g., 0.5 to 5 mole percent silanol groups).

In one embodiment, the crosslinking in step II) is accomplished by a second hydrosilylation reaction. In some embodiments, a crosslinker having the formula $R^1{}_qR^3{}_{(3-q)}SiO(R^1{}_2SiO_{2/2})_mSiR^3{}_{(3-q)}R^1{}_q$ where each $R^1$ is as defined herein; m varies from 0 to 50 (e.g., an average of from about 10 to about 50 D units; about 20 to about 50 D units; about 5 to about 40 D units; or about 10 to about 40 D units), alternatively 0 to 10, alternatively 0 to 5, alternatively m is 0; q is 0, 1, or 2, alternatively q is 2; $R^3$ is H, $R^1$, or $R^4$, as each term is defined herein; is added as an additional component in step II). In some embodiments, the crosslinker may contain either Si—H units (when $R^3$=H) or contain an unsaturated group (when $R^3$=$R^4$). As such, the crosslinker may react with the linear-resin organosiloxane block copolymer formed in step I) via a hydrosilylation reaction. In some embodiments, if the resin-linear organosiloxane block copolymer from step I) contains residual Si—H units, the crosslinker in step II) selected may contain an $R^4$ group to enable the hydrosilylation to proceed. In other embodiments, if the resin-linear organosiloxane block copolymer from step I) contains residual unsaturated groups, the crosslinker in step II) selected may contain Si—H units to enable the hydrosilylation to proceed.

When a second hydrosilylation reaction is used to effect the crosslinking in step II), in some embodiments, additional amounts of the hydrosilylation catalyst are added (in amounts as described herein) and similar reaction conditions may be used as described herein to effect the hydrosilylation in step II). In some embodiments, the second hydrosilylation is conducted in the same reaction vessel as in step I), e.g., once step I) is substantially completed.

In a further embodiment, the crosslinker is tetramethyldisiloxane $H(CH_3)_2SiOSi(CH_3)_2H$, e.g., when excess unsaturated groups remain on the resin-linear organosiloxane block copolymer from step I).

In a further embodiment, the crosslinker is divinyltetramethyldisiloxane $(H_2C=CH)(CH_3)_2SiOSi(CH_3)_2(HC=CH_2)$ e.g., when excess Si—H units remain on the resin-linear organosiloxane block copolymer from step I).

Step III) in the process is optional, and involves further processing the resin-linear organosiloxane block copolymer. Further processing includes, but is not limited to further processing the resin-linear organosiloxane block copolymer to enhance its storage stability and/or optical clarity. Thus, as used herein, the phrase "further processing" refers broadly to any further reaction or treatment of the formed resin-linear organosiloxane copolymer to, among other things, enhance its storage stability, and/or optical clarity. The resin-linear organosiloxane copolymer as produced in step II may, for example, still contain a significant amount of reactive "OZ" groups (that is ≡SiOZ groups, where Z is as defined herein), and/or X groups (where X is, e.g., introduced into the block copolymer when the organosilane having the formula $R^5{}_qSiX_{4-q}$ is used in step II). The OZ groups present on the resin-linear organosiloxane copolymer at this stage may be silanol groups that were originally present on the resin component, or alternatively may result from the reaction of the organosilane having the formula $R^5{}_qSiX_{4-q}$ with silanol groups, when the organosilane is used in step II). It is possible that such "OZ" or X groups may further react during storage, limiting shelf stability, or diminishing reactivity of the resin-linear organosiloxane copolymer during end-use applications. Alternatively, further reaction of residual silanol groups may further enhance the formation of the resin domains and improve the optical clarity of the resin-linear organosiloxane copolymer. Thus, optional step III) may be performed to further react OZ or X present on the organosiloxane block copolymer produced in step II) to improve storage stability and/or optical clarity. The conditions for step III) may vary, depending on the selection of the linear and resin components, their amounts, and the endcapping compounds used.

In one embodiment of the process, step III) is performed by reacting the resin-linear organosiloxane from step II) with water and removing any small molecular compounds formed in the process, such as acetic acid. In some embodiments, the resin-linear organosiloxane copolymer may be produced from a linear organosiloxane comprising an acetoxy group, and/or when an acetoxy silane is used in step II). Although not wishing to be bound by any theory, it is possible that in some embodiments, the resin-linear organosiloxane formed in step II) may contain a significant quantity of hydrolyzable Si—O—C(O)CH$_3$ groups, which may limit the storage stability of the resin-linear organosiloxane copolymer. Thus, water may be added to the resin-linear organosiloxane copolymer formed from step II), which may hydrolyze a substantial amount of Si—O—C(O)CH$_3$ groups to further link the trisiloxy units, and eliminate acetic acid. The formed acetic acid, and any excess water, may be removed by known separation techniques. The amount of water added in some embodiments may vary. In some embodiments, the amount of water added may be 10 weight %, or alternatively 5 weight % is added per total solids (as based on resin-linear organosiloxane copolymer in the reaction medium).

In one embodiment of the process, step III) is performed by reacting the resin-linear organosiloxane from step II) with an endcapping compound, including endcapping compounds selected from an alcohol, oxime, or trialkylsiloxy compound. In some embodiments, the resin-linear organosiloxane copolymer may produced from a linear organosiloxane where E is an oxime group. The endcapping compound may be a $C_1$-$C_{20}$ alcohol (e.g., $C_1$-$C_{20}$ alcohol, $C_1$-$C_{12}$ alcohol, $C_1$-$C_{10}$ alcohol, $C_1$-$C_6$ alcohol or $C_1$-$C_4$ alcohol) such as methanol, ethanol, propanol, butanol, or others in the series. Alternatively, the alcohol is n-butanol. The endcapping compound may also be a trialkylsiloxy compound, such as trimethylmethoxysilane or trimethylethoxysilane. The amount of endcapping compound may vary. In some embodiments, the amount of endcapping may be between 3 and 15 wt % (e.g., 3 to 10wt %, 5to 15wt %, 3to 5 wt %, 10to 15 wt %, 5to 10wt %, or 3to 12wt %) with respect to the resin linear organosiloxane block copolymer solids in the reaction medium.

Optional step III) in the process may, in addition to, or in place of "further processing," involve contacting the resin-linear organosiloxane block copolymer from step II) with a stabilizer. See, e.g., PCT Appl. No. PCT/US2012/067334, filed Nov. 30, 2012; and U.S. Provisional Appl. No. 61/566,031, filed Dec. 2, 2011, the entireties of which are incorporated by reference as if fully set forth herein.

Step IV) of the present process is optional, and involves removing the organic solvent used in the reactions of steps I) and II). The organic solvent may be removed by any known techniques. In some embodiments, the solvent is removed by heating the resin-linear organosiloxane copolymer compositions at elevated temperature, either at atmospheric conditions or under reduced pressures. In some embodiments, not all of the solvent is removed. In some embodiments, at least 20%, at least 30%, at least 40%, or at least 50% of the solvent is removed, e.g., at least 60%, at least 70%, at least 75%, at least 80% or at least 90% of the solvent is removed. In some embodiments, less than 20% of the solvent is removed, e.g., less than 15%, less than 10%, less than 5% or 0% of the solvent is removed. In other embodiments, from about 20% to about 100% of the solvent is removed, e.g., from about 30% to about 90%, from about 20% to about 80%, from about 30 to about 60%, from about 50 to about 60%, from about 70 to about 80% or from about 50% to about 90% of the solvent is removed.

The present disclosure further relates to the resin-linear organosiloxane copolymer composition prepared by any of the aforementioned processes, and subsequently formed solid compositions derived from these compositions.

In one embodiment, the present process provides organosiloxane block copolymers comprising:
  40 to 90 mole percent disiloxy units of the formula $[R^1{}_2SiO_{2/2}]$,
  10 to 60 mole percent trisiloxy units of the formula $[R^2SiO_{3/2}]$,
  0.5 to 10 mole percent silanol groups [≡SiOH];
  wherein:
  each $R^1$, at each occurrence, is independently a $C_1$ to $C_{30}$ hydrocarbyl, each $R^2$, at each occurrence, is independently a $C_1$ to $C_{20}$ hydrocarbyl;
  wherein:
  the disiloxy units $[R^1{}_2SiO_{2/2}]$ are arranged in linear blocks having an average of from 10 to 400 disiloxy units $[R^1{}_2SiO_{2/2}]$ per linear block, the trisiloxy units $[R^2SiO_{3/2}]$ are arranged in non-linear blocks having a molecular weight of at least 500 g/mole, and at least 30% of the non-linear blocks are crosslinked with each other, each linear block is linked by a hydrocarbylene group to at least one non-linear block, and
  the organosiloxane block copolymer has a weight average molecular weight ($M_w$) of at least 20,000 g/mole.

In some embodiments, the hydrocarbylene group is a $C_2$ to $C_{12}$ hydrocarbylene group. In some embodiments, the $C_2$ to $C_{12}$ hydrocarbylene group is —CH$_2$CH$_2$—.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., $[R^1{}_2SiO_{2/2}]$ units) are primarily bonded together to form polymeric chains having, in some embodiments, an average of from 10 to 400 D units (e.g., an average of about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks."

The T units (i.e., $[R^2SiO_{3/2}]$) are primarily bonded to each other to form branched polymeric chains, which are referred to as "non-linear blocks." In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units $[R^1{}_2SiO_{2/2}]$ are arranged in linear blocks having an average of from 10 to 400 disiloxy units $[R^1{}_2SiO_{2/2}]$ per linear block (e.g., about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units $[R^2SiO_{3/2}]$ are arranged in non-linear blocks having a molecular weight of at least 500 g/mole and at least 30% of the non-linear blocks are crosslinked with each other.

In some embodiments, the non-linear blocks have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to about 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other, wherein all of the percentages given herein to indicate percent non-linear blocks that are crosslinked are in weight percent. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other, from about 50% to about 60% of the non-linear blocks are crosslinked with each other; from about 60% to about 80% of the non-linear blocks are crosslinked with each other; or from about 60% to about 70% of the non-linear blocks are crosslinked with each other.

In some embodiments, the organosiloxane block copolymers of the embodiments described herein comprise 40 to 90 mole percent disiloxy units of the formula $[R^1_2SiO_{2/2}]$, e.g., 50 to 90 mole percent disiloxy units of the formula $[R^1_2SiO_{2/2}]$; 60 to 90 mole percent disiloxy units of the formula $[R^1_2SiO_{2/2}]$; 65 to 90 mole percent disiloxy units of the formula $[R^1_2SiO_{2/2}]$; 70 to 90 mole percent disiloxy units of the formula $[R^1_2SiO_{2/2}]$; or 80 to 90 mole percent disiloxy units of the formula $[R^1_2SiO_{2/2}]$; 40 to 80 mole percent disiloxy units of the formula $[R^1_2SiO_{2/2}]$; 40 to 70 mole percent disiloxy units of the formula $[R^1_2SiO_{2/2}]$; 40 to 60 mole percent disiloxy units of the formula $[R^1_2SiO_{2/2}]$; 40 to 50 mole percent disiloxy units of the formula $[R^1_2SiO_{2/2}]$; 50 to 80 mole percent disiloxy units of the formula $[R^1_2SiO_{2/2}]$; 50 to 70 mole percent disiloxy units of the formula $[R^1_2SiO_{2/2}]$; 50 to 60 mole percent disiloxy units of the formula $[R^1_2SiO_{2/2}]$; 60 to 80 mole percent disiloxy units of the formula $[R^1_2SiO_{2/2}]$; 60 to 70 mole percent disiloxy units of the formula $[R^1_2SiO_{2/2}]$; or 70 to 80 mole percent disiloxy units of the formula $[R^1_2SiO_{2/2}]$.

In some embodiments, the organosiloxane block copolymers of the embodiments described herein comprise 10 to 60 mole percent trisiloxy units of the formula $[R^2SiO_{3/2}]$ (T units) and/or $[SiO_{4/2}]$ units (Q units) (i.e., the mole percent of T and Q units, combined, add up to 10 to 60 mole percent), e.g., 10 to 20 mole percent trisiloxy units of the formula $[R^2SiO_{3/2}]$ and/or $[SiO_{4/2}]$ units; 10 to 30 mole percent trisiloxy units of the formula $[R^2SiO_{3/2}]$ and/or $[SiO_{4/2}]$ units; 10 to 35 mole percent trisiloxy units of the formula $[R^2SiO_{3/2}]$ and/or $[SiO_{4/2}]$ units; 10 to 40 mole percent trisiloxy units of the formula $[R^2SiO_{3/2}]$ and/or $[SiO_{4/2}]$ units; 10 to 50 mole percent trisiloxy units of the formula $[R^2SiO_{3/2}]$ and/or $[SiO_{4/2}]$ units; 20 to 30 mole percent trisiloxy units of the formula $[R^2SiO_{3/2}]$ and/or $[SiO_{4/2}]$ units; 20 to 35 mole percent trisiloxy units of the formula $[R^2SiO_{3/2}]$ and/or $[SiO_{4/2}]$ units; 20 to 40 mole percent trisiloxy units of the formula $[R^2SiO_{3/2}]$ and/or $[SiO_{4/2}]$ units; 20 to 50 mole percent trisiloxy units of the formula $[R^2SiO_{3/2}]$ and/or $[SiO_{4/2}]$ units; 20 to 60 mole percent trisiloxy units of the formula $[R^2SiO_{3/2}]$ and/or $[SiO_{4/2}]$ units; 30 to 40 mole percent trisiloxy units of the formula $[R^2SiO_{3/2}]$ and/or $[SiO_{4/2}]$ units; 30 to 50 mole percent trisiloxy units of the formula $[R^2SiO_{3/2}]$ and/or $[SiO_{4/2}]$ units; 30 to 60 mole percent trisiloxy units of the formula $[R^2SiO_{3/2}]$ and/or $[SiO_{4/2}]$ units; 40 to 50 mole percent trisiloxy units of the formula $[R^2SiO_{3/2}]$ and/or $[SiO_{4/2}]$ units; or 40 to 60 mole percent trisiloxy units of the formula $[R^2SiO_{3/2}]$ and/or $[SiO_{4/2}]$ units.

In some embodiments, the resin-linear organosiloxane block copolymers also contain silanol groups (≡SiOH). The amount of silanol groups present on the organosiloxane block copolymer may vary from 0.5 to 10 mole percent silanol groups [≡SiOH], alternatively from 2 to 5 mole percent silanol groups [≡SiOH], alternatively from 5 to 10 mole percent silanol groups [≡SiOH].

The silanol groups may be present on any siloxy units within the organosiloxane block copolymer. The amount described herein represent the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups may reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

The organosiloxane block copolymers of the embodiments described herein have a weight average molecular weight (Mw) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers of the embodiments described herein have a weight average molecular weight (Mw) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight (Mn) of from about 15,000 to about 50,000 g/mole; from about 15,000 to about 30,000 g/mole; from about 20,000 to about 30,000 g/mole; or from about 20,000 to about 25,000 g/mole. The average molecular weight may be readily determined using Gel Permeation Chromatography (GPC) techniques, such as those described in the Examples.

In some embodiments, the structural ordering of the disiloxy and trisiloxy units may be further described as follows: the disiloxy units are arranged in linear blocks having an average of from 10 to 400 disiloxy units per linear block, and the trisiloxy units are arranged in non-linear blocks having a molecular weight of at least 500 g/mole. Each linear block is linked to at least one non-linear block in the block copolymer. Furthermore, at least 30% of the non-linear blocks are crosslinked with each other,
- alternatively at least at 40% of the non-linear blocks are crosslinked with each other,
- alternatively at least at 50% of the non-linear blocks are crosslinked with each other.

In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinks within the block copolymer are, in some embodiments, primarily siloxane bonds, ≡Si—O—Si≡ resulting from the condensation of silanol groups, as discussed above.

The amount of crosslinking in the block copolymer may be estimated by determining the average molecular weight of the block copolymer, such as with GPC techniques. In some embodiments, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the selection of the organosiloxane resin used to prepare the block copolymer).

The present disclosure further provides curable compositions comprising:
a) the organosiloxane block copolymers as described herein, in some embodiments in combination with a stabilizer as described herein, and
b) an organic solvent.

In some embodiments, the organic solvent is an aromatic solvent, such as benzene, toluene, xylene, or combinations thereof.

In one embodiment, the curable compositions may further contain an organosiloxane resin (e.g., free resin that is not part of the block copolymer). The organosiloxane resin present in these compositions is, in some embodiments, the same organosiloxane resin used to prepare the organosiloxane block copolymer. Thus, the organosiloxane resin may comprise at least 60 mole % of $[R^2SiO_{3/2}]$ siloxy units in its formula (e.g., at least 70 mole % of $[R^2SiO_{3/2}]$ siloxy units or at least 80 mole % of $[R^2SiO_{3/2}]$ siloxy units; or 60-70 mole % $[R^2SiO_{3/2}]$ siloxy units, 60-80 mole % $[R^2SiO_{3/2}]$ siloxy units or 70-80 mole % $[R^2SiO_{3/2}]$ siloxy units), where each $R^2$ is independently a $C_1$ to $C_{20}$ hydrocarbyl. Alternatively, the organosiloxane resin is a silsesquioxane resin, or alternatively a phenyl silsesquioxane resin.

The amount of the organosiloxane block copolymers, organic solvent, and optional organosiloxane resin in the present curable composition may vary. The curable composition of the present disclosure may contain:
- 40 to 80 weight % of the organosiloxane block copolymer as described herein (e.g., 40 to 70 weight %, 40 to 60 weight %, 40 to 50 weight %);
- 10 to 80 weight % of the organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight); and
- 5 to 40 weight % of the organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %), such that the sum of the weight % of these components does not exceed 100%. In one embodiment, the curable compositions consist essentially of the organosiloxane block copolymer as described herein, the organic solvent, and the organosiloxane resin. In some embodiments, the weight % of these components sum to 100%, or nearly 100%.

In yet another embodiment, the curable compositions contain a cure catalyst. The cure catalyst may be selected from any catalyst known in the art to effect condensation cure of organosiloxanes, such as various tin or titanium catalysts. Condensation catalyst can be any condensation catalyst that may be used to promote condensation of silicon bonded hydroxy (=silanol) groups to form Si—O—Si linkages. Examples include, but are not limited to, amines and complexes of lead, tin, titanium, zinc, and iron. Other examples include, but are not limited to basic compounds, such as trimethylbenzylammonium hydroxide, tetramethylammonium hydroxide, n-hexylamine, tributylamine, diazabicycloundecene (DBU) and dicyandiamide; and metal-containing compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzoate, zinc laurate, zinc stearate, aluminium phosphate, and alminium triisopropoxide; organic titanium chelates such as aluminium trisacetylacetonate, aluminium bisethylacetoacetate monoacetylacetonate, diisopropoxybis (ethylacetoacetate)titanium, and diisopropoxybis(ethylacetoacetate)titanium. In some embodiments, the condensation catalysts include zinc octylate, zinc bezoate, zinc p-tert-butylbenzoate, zinc laurate, zinc stearate, aluminium phosphate, and aluminum triisopropoxide. See, e.g., U.S. Pat. No. 8,193, 269, the entire disclosure of which is incorporated by reference as if fully set forth herein. Other examples of condensation catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligo- and polycondensates of the above alkoxides, dialkyltin diacetate, tin(II) octoate, dialkyltin diacylate, dialkyltin oxide and double metal alkoxides. Double metal alkoxides are alkoxides containing two different metals in a particular ratio. In some embodiments, the condensation catalysts include titanium tetraethylate, titanium tetrapropylate, titanium tetraisopropylate, titanium tetrabutylate, titanium tetraisoocty-late, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005,460, the entire disclosure of which is incorporated by reference as if fully set forth herein. In addition, the condensation catalysts include titanates, zirconates and hafnates as described in DE 4427528 C2 and EP 0 639 622 B1, both of which are incorporated by reference as if fully set forth herein.

The organosiloxane block copolymers and curable compositions containing the organosiloxane block copolymer may be prepared by the methods known in the art.

Solid compositions containing the resin-linear organosiloxane block copolymers may be prepared by removing the solvent from the curable organosiloxane block copolymer compositions as described herein. The solvent may be removed by any known processing techniques. In one embodiment, a film of the curable compositions containing the organosiloxane block copolymers is formed, and the solvent is allowed to evaporate from the film. Subjecting the films to elevated temperatures, and/or reduced pressures, may accelerate solvent removal and subsequent formation of the solid curable composition. Alternatively, the curable compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

Although not wishing to be bound by any theory, it is possible that the structural ordering of the disiloxy and trisiloxy units in the organosiloxane block copolymer, as described herein, may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light (e.g., at wavelengths above 350 nm). The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions may have a viscosity of from about 1500 cSt to about 4000 cSt at 25° C., e.g., from about 1500 cSt to about 3000 cSt, from about 2000 cSt to about 4000 cSt or from about 2000 cSt to about 3000 cSt at 25° C.

Upon drying or forming a solid, the non-linear blocks of the block copolymer further aggregate together to form "nano-domains" As used herein, "predominately aggregated" means the majority (e.g., greater than 50%; greater than 60%; greater than 75%, greater than 80%, greater than 90%; from about 75% to about 90%, from about 80% to about 90%, or from about 75% to about 85%) of the non-linear blocks of the organosiloxane block copolymer are found in certain regions of the solid composition, described herein as "nano-domains." As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and, in some instances, lamellar shaped.

In a further embodiment, the solid organosiloxane block copolymers as described herein contain a first phase and an incompatible second phase, the first phase containing predominately the disiloxy units $[R^1{}_2SiO_{2/2}]$ as defined herein, the second phase containing predominately the trisiloxy units $[R^2SiO_{3/2}]$ as defined herein, the non-linear blocks being sufficiently aggregated into nano-domains which are incompatible with the first phase.

When solid compositions are formed from the curable compositions of the organosiloxane block copolymer, which may also contain an organosiloxane resin, as described herein, the organosiloxane resin also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

One advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer may cure and achieve high temperature stability when $T_{processing}$ is taken above $T_{cure}$. Thus, the present resin-linear organopolysiloxanes block copolymers may offer the significant advantage of being "re-processable" in conjunction with the benefits associated with silicones including hydrophobicity, high temperature stability, and moisture/UV resistance.

In one embodiment, the solid compositions of the organosiloxane block copolymers may be considered as "melt processable." In some embodiments, the solid compositions, such as a coating formed from a film of a solution containing the organosiloxane block copolymers, exhibit fluid behavior at elevated temperatures, that is upon "melting." The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta (tan δ) as a function of temperature storage using commercially available instruments. For example, a commercial rheometer (such as TA Instruments' ARES-RDA with 2KSTD standard flexular pivot spring transducer, with forced convection oven) may be used to measure the storage modulus (G'), loss modulus (G") and tan delta as a function of temperature. Test specimens (e.g., 8 mm wide, 1 mm thick) may be loaded in between parallel plates and measured using small strain oscillatory rheology while ramping the temperature in a range from 25° C. to 300° C. at 2° C./min (frequency 1 Hz).

In some embodiments, the tan delta=1 is from about 3 to about 5 hours at 150° C., e.g., from about 3 to about 5 minutes at 150° C., from about 10 to about 15 minutes at 150° C., from about 10 to about 12 minutes at 150° C., from about 8 to about 10 minutes at 150° C., from about 30 minutes to about 2.5 hours at 150° C., from about 1 hour to about 4 hours at 150° C. or from about 2.5 hours to about 5 hours at 150° C.

In a further embodiment, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions of the organosiloxane block copolymers around device architectures at temperatures below $T_{cure}$, after an initial coating or solid is formed on the device. This feature is very beneficial to encapsulated various electronic devices.

In one embodiment, the solid compositions of the organosiloxane block copolymers may be considered as "curable." In some embodiments, the solid compositions, such as a coating formed from a film of a solution containing the organosiloxane block copolymers, may undergo further physical property changes by further curing the block copolymer. As discussed herein, the present organosiloxane block copolymers contain a certain amount of silanol groups. It is possible that the presence of these silanol groups on the block copolymer permit further reactivity, e.g., a cure mechanism. Upon curing, the physical properties of solid compositions may be further altered.

Alternatively, the "melt processability," the extent of cure, and/or the rate of cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.5 MPa to about 10 MPa, from about 2 MPa to about 10 MPa, from about 5 MPa to about 10 MPa or from about 7 MPa to about 10 MPa. The present solid compositions derived from the aforementioned organosiloxane block copolymers may have an initial % elongation at break (or rupture) greater than 40%, alternatively greater than 50%, or alternatively greater than 75%. In some embodiments, the solid compositions may have a % elongation at break (or rupture) of from about 20% to about 90%, e.g., from about 25% to about 50%, from about 20% to about 60%, from about 40% to about 60%, from about 40% to about 50%, or from about 75% to about 90%. As used herein, tensile strength and % elongation at break are measured according to ASTM D412.

Some of the embodiments of the present invention relate to optical assemblies and articles comprising the compositions described herein such as those described in PCT/US2012/071011, filed Dec. 20, 2012; PCT/US2013/021707, filed Jan. 16, 2013; and PCT/US2013/025126, filed Feb. 7, 2013, all of which are incorporated by reference as if fully set forth herein. Accordingly, some embodiments of the present invention relate to an LED encapsulant comprising an organosiloxane block copolymer described herein.

The term "about," as used herein, can allow for a degree of variability in a value or range, for example, within 10%, within 5%, or within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt %. All measurements were conducted at 23° C. unless indicated otherwise.

Reference Example 1

Preparation of a Resin Having the Formula
$M^{Vi}_{0.15}T^{pH}_{0.76}Q_{0.082}$

A 1 L 4-neck round bottom flask was loaded with phenyl-trimethoxysilane (277.6 g, 1.40 moles), tetraethoxysilane (62.50 g, 0.300 moles), and tetramethyldivinyldisiloxane (27.96 g, 0.300 moles Si). The flask was equipped with a thermometer, teflon stir paddle, and a Dean Stark apparatus attached to a water-cooled condenser. A nitrogen blanket was applied. Trifluoromethanesulfonic acid (109 µL) was added at room temperature. Reaction mixture was heated to 50° C. and deionized (DI) water (48.64 g, 2.70 moles) was added slowly. It was then heated at 60° C. for 3 hours. Alcohol (142.6 g) was distilled off and then toluene (227.0 g) was added. Next a 10 wt % aqueous solution of KOH (2.96 g) was added to neutralized FC24 and for base bodying the resin along with some DI water (12.16 g). Reaction mixture as heated to reflux and 70.0 g of volatiles were removed by distillation. Some more toluene (10.59 g) was added along with more DI water (36.48 g). The reaction mixture was heated back up to reflux and water was removed by azeotropic distillation. After the majority of the water was removed, reflux was continued for 3 hours. It was cooled to room temperature and then a 10 wt % solution of glacial acetic acid in toluene (3.64 g) was added to neutralize the KOH. It was mixed at room temperature overnight and then filtered the following day through a 1.2 µm filter. Solventless product was a clear, colorless, "crunchy" solid at room temperature with a $T_g$ of 150° C.

Reference Example 2

Preparation of a Resin Having the Formula
$M^H_{0.14}T^{pH}_{0.85}$

A 2 L 3-neck round bottom flask was loaded with phenyl-T hydrolyzate (550.0 g, 4.03 moles Si, Dow Corning 217 Flake) and toluene (725.0 g). The flask was equipped with a teflon stir paddle, thermometer and a water-cooled condenser. System was setup so that HCl gas was captured in a water trap. An addition funnel was loaded with toluene (100.0 g), chlorodimethylsilane (57.10 g, 0.603 moles Si), and tetramethyldisiloxane (7.40 g, 0.110 moles Si). Resin was dissolved completely in toluene and then the chlorosilane solution was added slowly at room temperature. It was heated at 35° C. for 1 hour and then 50° C. for 1 hour. Residual HCl was removed be water washing by repeating the following process several times: added 40 mL of DI water, heated at 75° C. for 15 minutes, removed aqueous phase. The following process was then repeated three times: added 10 mL of isopropanol (IPA), heated at 75° C. for 15 minutes, added 30 mL of DI water, heated at 75° C. for 15 minutes, removed aqueous phase. Reaction mixture was heated to reflux and water was removed by azeotropic distillation. Resin was stripped to dryness using a rotavapor. Initially the oil bath was set at 40° C. The following process was repeated three times to reduce chloride content further: added 40 mL of methanol and then removed under vacuum. The oil bath temperature was then increase to 140° C. and a vacuum of −1 mm Hg was applied to remove the remaining solvent. Material was a viscous liquid at this temperature. The resin was poured out into a teflon coated pan in a 150° C. oven. Solventless product was a clear, colorless, "crunchy" solid at room temperature with a $T_g$ of 49° C.

Example 1

Preparation of a Resin Linear Copolymer Containing 28 Wt % MTQ Resin and 72 wt % PDMS (~184 dp)

A 250 mL 3-neck round bottom flask was loaded with $M^{Vi}_{0.15}T^{Ph}_{0.76}Q_{0.082}$ resin from Reference Example 1 (26.14 g, 0.0163 moles vinyl, 48.4% in toluene, Mw=2670), Si—H terminated PDMS (32.4 g, Mw=32,000), and toluene (91.87 g). Reaction mixture was clear. Heated reaction mixture to 100° C. and then added 0.705 g of Pt(IV) dissolved in toluene (Pt(IV) solution concentration—1599 ppm Pt). Heated at reflux (110° C.) for 1 hour. Dried film was opaque. Added a solution of 10 wt % tetramethyldisiloxane diluted in toluene (1.36 g, 0.00202 moles Si—H). Heated at 110° C. for 2 hours. The resulting sheet was an optically clear, grabby elastomer at room temperature. Product Mw=202,000 (excludes free resin), OZ<1 mole %.

Example 2

Preparation of a Resin Linear Copolymer Containing 45 Wt % Phenyl-T Resin and 55 Wt % 90 Dp PhMe Polydisiloxane A 500 mL 4-neck round bottom flask was loaded with: toluene (120.0 g), Si—H functional phenyl-T resin of Reference Example 2 having the average formula $M^H_{0.14}T^{Ph}_{0.85}$ (54.0 g, 0.435 moles Si, 0.061 moles Si—H) and a 90 dp vinyl siloxane (66.0 g, 0.488 moles Si, 0.0108 moles vinyl). The flask was equipped with a thermometer, teflon stir paddle, and a Dean Stark apparatus attached to a water-cooled condenser. A nitrogen blanket was applied, Dean Stark was prefilled with toluene, and a heating mantle was used for heating. Then, 1.03 g of Pt (IV) catalyst solution was at room temperature. This amounts to 7.5 ppm Pt based on 240 g of reaction solution. The contents were then heated at reflux for 3.75 hours. Subsequently, the reaction mixture contents were cooled to 108° C. and then 2.03 g (0.0109 moles) of tetramethyldivinyldisiloxane were added. The mixture was then heated at reflux for 2 hours. Upon cooling to 80° C., 6.0 g of carbon black were added. This amounts to 5 wt % based on solids (120 g). After mixing overnight at 80° C., the reaction mixture was pressure filtered through a 0.45 μm filter. The resulting non-volatile containing (NVC) samples were transparent. No haze was visible when immediately removed from the oven.

The invention claimed is:

1. A process for preparing an organopolysiloxane block copolymer comprising:
   I) reacting
      a) a linear organosiloxane having the formula

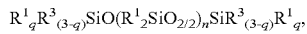

wherein:
         each $R^1$, at each occurrence, is independently a $C_1$ to $C_{30}$ hydrocarbyl free of aliphatic unsaturation,
         each $R^3$, at each occurrence, is independently H, $R^1$, or $R^4$, wherein
         each $R^4$, at each occurrence, is a $C_2$ to $C_{12}$ hydrocarbyl group having at least one aliphatic unsaturated bond, and
         n is 10 to 400, q is 0, 1, or 2;
      b) an organosiloxane resin having the average formula:

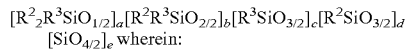

wherein:
         each $R^2$, at each occurrence, is independently a $C_1$ to $C_{20}$ hydrocarbyl free of aliphatic unsaturation,
         each $R^3$, at each occurrence, is independently H, $R^1$, or $R^4$, wherein each $R^4$, at each occurrence, is a $C_2$ to $C_{12}$ hydrocarbyl group having at least one aliphatic unsaturated bond,
         the subscripts a, b, c, d, and e represent the mole fraction of each siloxy unit present in the organosiloxane resin and range as follows:
            a is about 0 to about 0.7,
            b is about 0 to about 0.3,
            c is about 0 to about 0.8,
            d is about 0 to about 0.9,
            e is about 0 to about 0.7,
            with the provisos that a+b+c>0, c+d+e≥0.6, and a+b+c+d+e≈1;
         with the proviso that at least one $R^3$ substituent is H on either of the linear organosiloxane or organosiloxane resin, and at least one $R^3$ substituent is $R^4$ on the other organosiloxane; and
      c) a hydrosilylation catalyst;
         to form a resin-linear organosiloxane block copolymer;
         wherein the amounts of a) and b) used in step I) are selected to provide the resin-linear organosiloxane block copolymer with 40 to 90 mole % of disiloxy units [$R^1_2SiO_{2/2}$] and 10 to 60 mole % of [$R^2SiO_{3/2}$] and/or [$SiO_{4/2}$] siloxy units, and wherein at least 95 weight percent of the linear organosiloxane added in step I) is incorporated into the resin-linear organosiloxane block copolymer,
   II) reacting the resin-linear organosiloxane block copolymer from step I) to crosslink the [$R^2SiO_{3/2}$] and/or [$SiO_{4/2}$] siloxy units of the resin-linear organosiloxane block copolymer sufficiently to increase the weight average molecular weight ($M_w$) of the resin-linear organosiloxane block copolymer by at least 50%; and
   III) optionally further processing the resin-linear organosiloxane block copolymer from step II).

2. The process of claim 1, wherein the further processing enhances storage stability and/or optical clarity and/or optionally adding to the resin-linear organosiloxane block copolymer from step II) a stabiliser.

3. The process of claim 1, wherein the reaction in step II) comprises a hydrosilylation reaction.

4. The process of claim 1, wherein the resin-linear organosiloxane block copolymer is formed in the presence of a solvent.

5. The process of claim 4, further comprising removing the solvent before or after the further processing.

6. The process of claim 1, wherein component a) has the average formula:

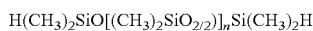

where n may vary from 10 to 400,
and component b) has the average formula

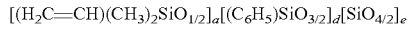

where the subscripts a, d, and e are as defined in claim 1.

7. The process of claim 1, wherein component a) has the average formula

where n may vary from 10 to 400,
and component b) has the average formula

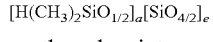

where the subscripts a and e are as defined in claim 1.

8. The process of claim 1, wherein a crosslinker is added in step II) and/or in step I), where the crosslinker has the formula:

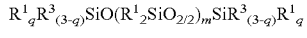

where each $R^1$, at each occurrence, is independently a $C_1$ to $C_{30}$ hydrocarbyl;
m varies from 0 to 50, q is 0, 1, or 2;
each $R^3$, at each occurrence, is independently H, $R^1$, or $R^4$, wherein each $R^4$, at each occurrence, is a $C_2$ to $C_{12}$ hydrocarbyl having at least one aliphatic unsaturated bond.

9. The process of claim 8, wherein the crosslinker is tetramethyldisiloxane or divinyltetramethyldisiloxane.

10. The process of claim 1, wherein step II) further comprises adding an organosilane having the formula $R^5_qSiX_{4-q}$, where $R^5$ is a $C_1$ to $C_8$ hydrocarbyl or a $C_1$ to $C_8$ halogen-substituted hydrocarbyl, X is a hydrolyzable group, and q is 0, 1, or 2.

11. The process of claim 10, wherein the organosilane is an alkyltriacetoxysilane.

12. The process of claim 11, wherein the alkyltriacetoxysilane is a mixture of two alkyltriacetoxysilanes.

13. The process of claim 12, wherein the mixture of two alkyltriacetoxysilanes comprise methyltriacetoxysilane and/or ethyltriacetoxysilane.

14. The process of claim 1, wherein the organosiloxane resin is chosen from:
[H(CH$_3$)$_2$SiO$_{1/2}$]$_a$[(C$_6$H$_5$)SiO$_{3/2}$]$_d$;
[H(CH$_3$)$_2$SiO$_{1/2}$]$_a$[(CH$_3$)$_2$SiO$_{2/2}$]$_b$[(C$_6$H$_5$)SiO$_{3/2}$]$_d$;
[H(CH$_3$)$_2$SiO$_{1/2}$]$_a$[(C$_6$H$_5$)$_2$SiO$_{2/2}$]$_b$[(C$_6$H$_5$)SiO$_{3/2}$]$_d$;
[H(CH$_3$)$_2$SiO$_{1/2}$]$_a$[(C$_6$H$_5$)(CH$_3$)SiO$_{2/2}$]$_b$[(C$_6$H$_5$)SiO$_{3/2}$]$_d$;
[H(CH$_3$)$_2$SiO$_{1/2}$]$_a$[(C$_6$H$_5$)SiO$_{3/2}$]$_d$[SiO$_{4/2}$]$_e$;
[H(CH$_3$)$_2$SiO$_{1/2}$]$_a$[(CH$_3$)$_2$SiO$_{2/2}$]$_b$[SiO$_{4/2}$]$_e$;
[H(CH$_3$)$_2$SiO$_{1/2}$]$_a$[SiO$_{4/2}$]$_e$; and
combinations thereof.

15. The process of claim 1, wherein the organosiloxane resin is chosen from:
[Vi(CH$_3$)$_2$SiO$_{1/2}$]$_a$[(C$_6$H$_5$)SiO$_{3/2}$]$_d$;
[Vi(CH$_3$)$_2$SiO$_{1/2}$]$_a$[(CH$_3$)$_2$SiO$_{2/2}$]$_b$[(C$_6$H$_5$)SiO$_{3/2}$]$_d$;
[Vi(CH$_3$)$_2$SiO$_{1/2}$]$_a$[(C$_6$H$_5$)$_2$SiO$_{2/2}$]$_b$[(C$_6$H$_5$)SiO$_{312}$]$_d$;
[Vi(CH$_3$)$_2$SiO$_{1/2}$]$_a$[(C$_6$H$_5$)(CH$_3$)SiO$_{2/2}$]$_b$[(C$_6$H$_5$)SiO$_{3/2}$]$_d$;
[Vi(CH$_3$)$_2$SiO$_{1/2}$]$_a$[(C$_6$H$_5$)SiO$_{3/2}$]$_d$[SiO$_{4/2}$]$_e$;
[Vi(CH$_3$)$_2$SiO$_{1/2}$]$_a$[(CH$_3$)$_2$SiO$_{2/2}$]$_b$[SiO$_{4/2}$]$_e$;
[Vi(CH$_3$)$_2$SiO$_{1/2}$]$_a$[SiO$_{4/2}$]$_e$; and
combinations thereof.

16. The process of claim 1, wherein said further processing comprises reacting the resin-linear organosiloxane from step II) with an endcapping compound selected from an alcohol, oxime, or trialkylsiloxy compound.

17. The process of claim 16, wherein instead of or in addition to said further processing, the organosiloxane block copolymer from step II) is contacted with a stabiliser.

18. A resin-linear organosiloxane block copolymer comprising:
40 to 90 mole percent disiloxy units of the formula [R$^1_2$SiO$_{2/2}$],
10 to 60 mole percent trisiloxy units of the formula [R$^2$SiO$_{3/2}$],
0.5 to 10 mole percent silanol groups [≡SiOH];
wherein:
each R$^1$, at each occurrence, is independently a C$_1$ to C$_{30}$ hydrocarbyl,
each R$^2$, at each occurrence, is independently a C$_1$ to C$_{20}$ hydrocarbyl;
wherein:
the disiloxy units [R$^1_2$SiO$_{2/2}$] are arranged in linear blocks having an average of from 10 to 400 disiloxy units [R$^1_2$SiO$_{2/2}$] per linear block,
the trisiloxy units [R$^2$SiO$_{3/2}$] are arranged in non-linear blocks having a molecular weight of at least 500 g/mole, and at least 30% of the non-linear blocks are crosslinked with each other, each linear block is linked by a hydrocarbylene group to at least one non-linear block, and
the organosiloxane block copolymer has an average molecular weight (M$_w$) of at least 20,000 g/mole.

19. The resin-linear organosiloxane block copolymer of claim 18, wherein the hydrocarbylene group is a C$_2$ to C$_{12}$ hydrocarbylene group.

20. The resin-linear organosiloxane block copolymer of claim 19, wherein the C$_2$ to C$_{12}$ hydrocarbylene group is —CH$_2$CH$_2$—.

* * * * *